United States Patent [19]

Padgett et al.

[11]  4,274,147
[45]  Jun. 16, 1981

[54] STATIC READ ONLY MEMORY

[75] Inventors: Clarence W. Padgett, Westminster; Melvin L. Marmet, Corona; Mark R. Tennyson, Anaheim, all of Calif.

[73] Assignee: Rockwell International Corporation, El Dequndo, Calif.

[21] Appl. No.: 72,383

[22] Filed: Sep. 4, 1979

[51] Int. Cl.³ .......................... G11C 7/00; G11C 7/06
[52] U.S. Cl. .................................... 365/189; 365/104; 365/205
[58] Field of Search ............... 365/104, 189, 207, 205; 340/166 R

[56] References Cited

U.S. PATENT DOCUMENTS

| 4,069,427 | 1/1978 | Masuda | 365/104 |
| 4,142,176 | 2/1979 | Dozier | 365/104 |
| 4,183,093 | 1/1980 | Kawagoe | 365/104 |

OTHER PUBLICATIONS

Balasubramanian et al., "Two Device Per Bit, Precharged ROS With Differential Sensing", IBM Tech. Disc. Bul., vol. 19, No. 1, 6/76, pp. 164–165.

Primary Examiner—Stuart N. Hecker
Attorney, Agent, or Firm—H. Fredrick Hamann; Daniel R. McGlynn

[57] ABSTRACT

A static read only memory fabricated with field effect transistors of either the depletion type or the enhancement type connected in series. The read only memory includes a compact sensing circuit for detecting relatively small voltage swings at each node corresponding to a bit line of the memory cell, and a highly sensitive differential sense amplifier including first and second cascaded connected inverter stages.

10 Claims, 2 Drawing Figures

STATIC READ ONLY MEMORY

BACKGROUND OF THE INVENTION

1. Field of the Invention

The invention relates to static semiconductor read only memories, and in particular memory circuits composed of field effect transistors of either the depletion mode or enhancement mode selected depending upon the information to be stored therein.

2. Prior Art

Various types of semiconductor read only memories (ROMs) are known in the prior art. U.S. Pat. No. 4,074,238 describes a read only memory including a plurality of memory circuits connected in parallel with one another across a first line and a second line. In each of such memory circuits a first insulated gate field effect transistor (FET) of either the depletion type or the enhancement type is provided. The type of each FET is individually selected depending upon the particular information bit to be stored in that bit cell. The FETs are connected in series with a second insulated gate FET of enhancement type. Such a construction enables a ROM to be implemented by merely modifying the mask pattern for forming the FETs in the circuit.

Another implementation of a ROM using enhancement and depletion type FETs is shown in U.S. Pat. No. 4,142,176. In such patent the ROM is structured as a series structure (NAND logic), with the transistors arranged in an array of input rows and output columns.

Logic programming of the matrix may be realized by providing predetermined ones of the MOS elements of the matrix with structurally differentiated portions with respect to the remaining elements. The transistors of the matrix may be identified as elements of first and second sets, the elements of each set including structurally differentiated portions which provide first and second modes of operation, respectively. For example, the elements of the first set may have structurally differentiated portions relative to the elements of the second set which permit operation of the transistors of the first set in the first mode in which current is conducted through source and drain portions in response to a first applied gate potential corresponding to a first logic state, (for example $V_D$ volts for a logic "1" for N-channel enhancement mode MOSFET devices), and in which the flow of current through the source and drain is prevented in response to a second applied gate potential corresponding to a second logic state, (for example zero gate bias for a logic "0"). The elements of the second set may have structurally differentiated portions which permit operation of the elements of the second set in the second mode wherein a conductive path through source and drain portions exists without regard to the logic state corresponding to the applied gate potential, (for example, depletion mode MOSFET devices).

Such an arrangement is disadvantageous because of the apparent requirement that a precharge signal be applied for high speed operation with relatively large voltage swings to the NAND gate for suitable operation. The latter requirements means that external clock signals must be applied to the integrated circuit for operation, i.e., the circuit is a "dynamic" one with relatively large voltage swings. There are many circuit designs and applications for ROMs which are purely static, i.e. dynamic circuits are not used, and therefore such prior are dynamic ROMs could not be used in such applications.

SUMMARY OF THE INVENTION

Briefly, and in general terms, the invention is concerned with semiconductor memories, and in particular with read only memories which are entirely static in operation.

The present invention consists of a plurality of substantially identical memory cells each composed of one transistor device, each transistor device including a control electrode and first and second conduction path electrodes, wherein a plurality of such memory cells are arranged in sets, each set including a plurality of input rows and a plurality of output columns, the control electrode of the transistor devices in each input row being formed in common, and the first condition path electrodes of the transistor devices within each output column being connected in electrical series to the second conduction path electrode of adjacent transistor devices in each output column, so that a control electrode-controlled series conduction path is established through each output column of transistor devices in each set, means connecting each corresponding input row in a group of sets of memory cells to form common input lines, means connecting each of the output columns in a group to form a single common bit line, each of the bit lines in a group being connected to a single common group output line, a source of relatively positive and a source of relatively negative potential, the source of relatively positive potential being selectively connectable with the single common group output line so as to be connectable with one end of the series conduction path through each output column of transistors, the other end of the series conduction path being connected to the source of relatively negative potential.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

DESCRIPTION OF THE PREFERRED EMBODIMENT

The present invention is concerned with an improved circuit for a read only memory (ROM) which comprises a logic matrix of MOS field effect transistor elements arranged in an array of input rows and output columns which correspond to predetermined logic combinations of inputs, together with a set of associated sense amplifiers. Although the preferred embodiment of the memory circuit as disclosed herein is fabricated on a single semiconductor chip, the fabrication of such a memory circuit as one or more sub-circuits or their equivalent which may be implemented as independent circuits or even independent chips connected to the integrated memory is another way of implementing the present invention.

Figure 1:
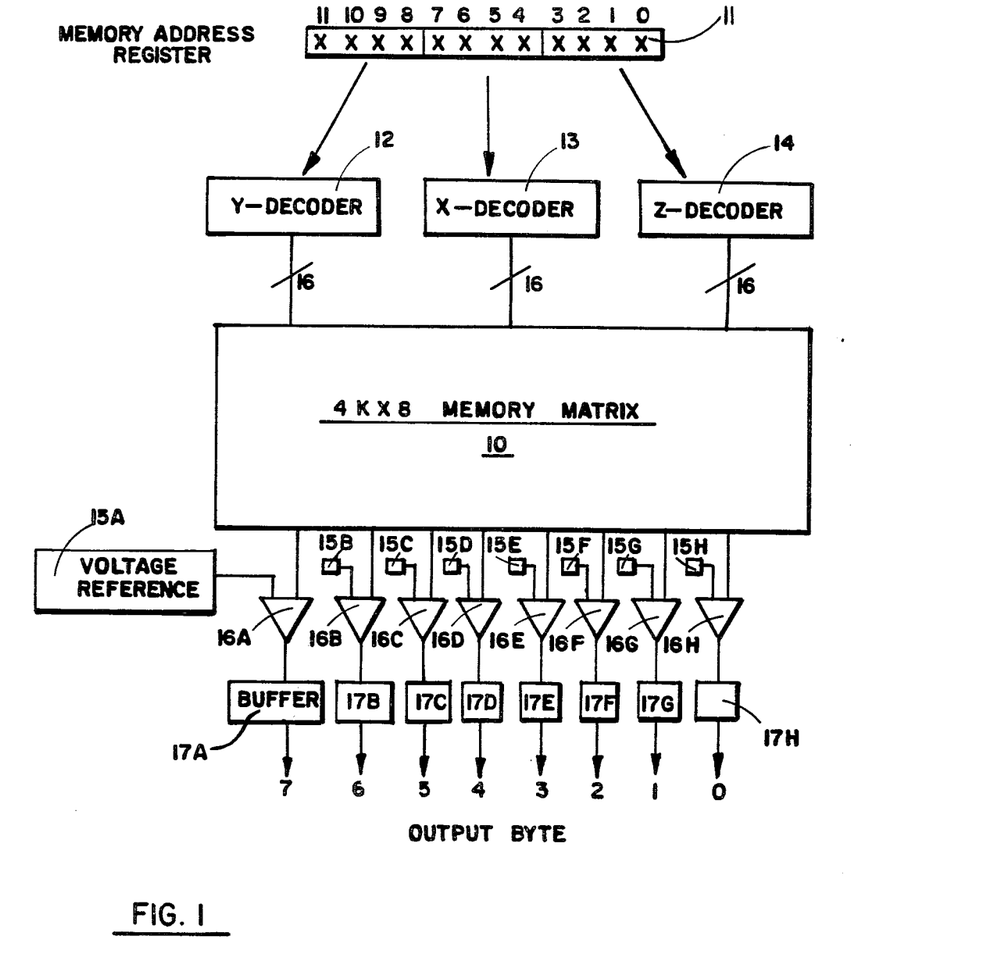
FIG. 1 is a highly simplified block diagram of a typical memory matrix, addressing system and sense amplifier array according to the present invention.

Referring now to FIG. 1, there is shown a ROM memory matrix, together with associated addressing and sense amplifier circuits according to the present invention. The Figure shows the memory matrix 10, and an addressing system which includes a memory address register 11 and address decoders 12, 13, and 14. To address a particular memory word or byte defined as a set of cells in the memory matrix 10, address signals are applied to the address and appear as row inputs to the ROM memory matrix. The memory address register 11 and the address decoders 12, 13, 14 may be provided by conventional circuits which are known in the rt and which in combination are operable to select an individual memory cell or set of cells from the ROM memory matrix 10 for reading in response to a digital address signal. Unlike similar arrangements in the prior art, there is no additional circuitry in the integrated circuit according to the present invention for precharging and synchronizing various bit lines using externally or internally generated supplied clock signals. The memory according to the present invention is therefore totally static in operation.

The ROM memory matrix 10 as shown in the embodiment of FIG. 1 is organized into a 4K×8 array. A read only memory is a storage device in which logical information is stored in a non-volatile manner.

Figure 2:
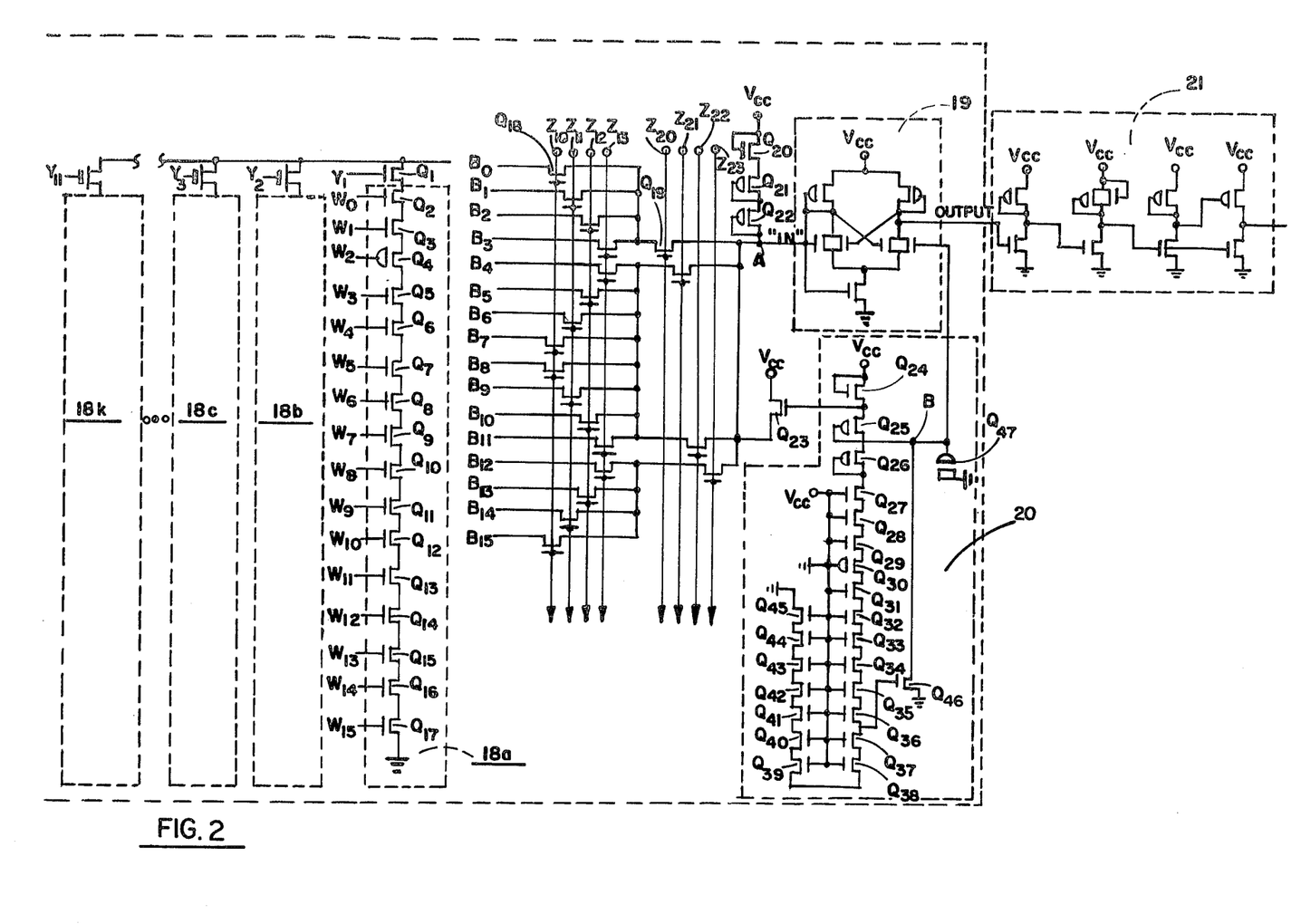
FIG. 2 is a schematic diagram of a portion of the memory constructed according to the teachings of the present invention.

Referring now to FIG. 2, the memory cells according to the present invention are arranged in groups, each group including a set of input rows and a set of output columns. In a 16 K memory, there are 64 such groups, each group consisting of sixteen rows and sixteen columns, in one typical configuration. In the present embodiment, the input rows are labelled W0, W1, W2, ... W15. These input rows then correspond to word lines to which a word address signal is applied. The output columns correspond to columns of transistors labelled 18A, 18B, 18C, ... 18P. There are a total of sixteen such output columns in the group according to the preferred embodiment. It is further noted that such an output column forms a NAND gate. The individual elements of the NAND gate, or bit cells in the memory matrix, are formed by MOSFET transistor devices.

The MOSFET transistors in the NAND gate are labelled $Q_2, Q_3, \ldots Q_{17}$. Such MOSFETs $Q_2-Q_{17}$ are standard insulated gate field effect transistors of either the enhancement or depletion type, whereby conduction between the first and second regions is controlled by voltage on the insulated gate or control electrode. The input rows W0, ... W15 are connected to the control electrode of the MOSFETs. In the preferred embodiment according to the present invention, all of the MOSFET circuits are fabricated as n channel MOS devices, although it is understood that the circuits and other features of the present invention are also applicable to p channel devices, other transistor devices, or devices using another semiconductor technology.

The MOS transistors in the column are structurally differentiated from one another by the specific programming of the user. Programming the transistors is done at preselected locations during the fabrication process by specifying whether the MOS transistor is to be of enhancement type or depletion type. Conventional ion implantation techniques are used to provide the appropriate concentration of dopant atoms at the surface in the channel region for specifying either depletion type or enhancement type characteristics for such transistors. The differentation may be provided by ion implanting the channel regions with ion impurities of different concentration levels, or alternatively by ion impurities with different conductivity types. Alternatively structural differentiation of one type of transistor relative to the other may also be provided by implanting ion impurities in the channel region of the element of one type of transistor but not in the other type of transistor.

It is further noted that the drains of the transistors within each output column, 18A, 18B ... 18P, are connected in electrical series to the sources of adjacent transistors in that output column, so that a gate-controlled series conduction path is established through each output column of transistors in each group. The gates of the transistors in each respective input row are also formed in common. For this reason, the input line W0 connected is designated by the same label W0 being connected to the gate of the first transistor in the series. Correspondingly, the gate of the second transistor in the series is labelled W1. This is meant to represent the fact that the input row electrode W0 is common to each of the first transistor devices in each respective group, while the input row electrode W1 is common to the second transistor device in each respective group, and so on, up to input row W15.

The first transistor shown in each of the output columns 18A, 18B, etc., such as the transistor $Q_1$ in output column 18A, is a select transistor. The function of the select transistor is to select the particular output column being used and accessed by the memory at a specific time when a select signal is supplied to the select transistor. The select transistor is a MOS field effect transistor having its conduction path connected in series with the MOSFETs $Q_2-Q_{17}$ in the NAND gate. The select signal is applied to the gate electrode of the select transistor over the select lines Y0, Y1, Y2, ... etc.

The signals on the lines W0, W1, W2, etc., control the series conduction path in each of the output columns 18A, 18B, 18C, ... 18P. If, in a selected output column (i.e. an output column in which the select transistor is "on") an input signal is applied to a gate of an enhancement type MOSFET, the result will be a relatively positive voltage signal on the bit line corresponding to a logical "1" output signal, i.e. logical "1" on the bit line, or "0" at the output pin. If an input signal on a word line is applied to a depletion type MOSFET a relatively negative voltage signal will appear on the bit line. Thus a gate-controlled series conduction path is established in each output column of transistors in each group.

The phrase "input signal" here refers to a "low" or relatively negatively voltage signal. It is noted that only one of the word lines W0–W15 is low at a time, i.e. the X-Decode (which generates the W- signals) is active low, one line is low, and fifteen lines are high. The opposite is true for the Y-Decode (which generates the Y- signals). The Y0, Y1, ... etc. signals, the "select signals", are such that, at any time, one is high and fifteen are low.

It is the active low characteristic of the X-Decode which enables one to distinguish between an enhancement MOSFET and depletion MOSFET in a memory cell column (18a, etc.). When a MOSFET is selected in the column (i.e. its gate is low), all other MOSFETs in the column have their gates high. Thus a conduction path exists (from bit line to ground) if an only if there is a conduction path through the selected MOSFET.

Since the gate of the selected MOSFET is low, a conduction path will exist if the MOSFET is depletion type, and no path will exist if the MOSFET is enhancement type.

The voltage level of the bit line depends upon the existence or non-existence of this conduction path to ground. If no path exists then the bit line has a relatively high potential. If a path does exist then the bit line has a relatively low potential.

A low potential on the bit line corresponds to a high potential, (logical "1") at the output pin, and vica-versa.

Means are further provided for connecting each of the output columns in a group to form a single common bit line. In the present illustration each of the output columns 18A, 18B, 18C, . . . 18P are connected together at the drain terminal of the select transistors Q1, . . . etc. in a common node which is called bit line B0. Fifteen other bit lines B1–B15 are also formed corresponding to different groups of memory cells according to the presently described configuration. Each one of such bit lines has associated with it sixteen different output columns of NAND gates associated with it. It is pointed out that the word lines W0 through W15 for each of the output columns for each of the bit lines B1 through B15 are all connected in common.

Associated with each of the bit lines B0 through B15 are two further select transistors. In the example chosen of considering bit line B0, these are the select transistors $Q_{18}$ and $Q_{19}$. A select signal is supplied on select line Z10 which is applied to the gate of the MOSFET $Q_{18}$ to turn MOSFET $Q_{18}$ on, while a signal applied to select line Z20 is applied to the gate of transistor $Q_{19}$ to turn transistor $Q_{19}$ on. If select signals appear on both select lines Z10 and Z20, and thus are applied to both $Q_{10}$ and $Q_{20}$ simultaneously, a series conduction path is established between the bit line B0 and the pull-up transistor group consisting of MOS field effect transistors $Q_{20}$, $Q_{21}$, and $Q_{22}$, and thereby to the input marked "input A" to the sense amplifier 19.

The MOSFETs $Q_{20}$, $Q_{21}$, and $Q_{22}$ form a controlled pull-up resistance and voltage to charge the selected bit line to a predetermined voltage. The first MOSFET $Q_{20}$ is an enhancement mode MOSFET having its drain terminal connected to the source of relatively positive potential $V_{CC}$, and its gate electrode connected to the same source $V_{CC}$. The MOSFET $Q_{21}$ is a depletion type MOSFET having one conduction path electrode connected to the source terminal of MOSFET $Q_{20}$ and its gate connected to its other conduction path electrode. The MOSFET $Q_{22}$ is a depletion type MOSFET identically sized with MOSFET $Q_{21}$ having its conduction path terminal connected to the gate electrode of MOSFET $Q_{21}$ and its other conduction path electrode connected to the selected bit line. The gate of MOSFET $Q_{22}$ is also connected to the selected bit line. The series connection of two equally sized depletion type MOSFETs is chosen to achieve a specific resistance which can be duplicated in another part of the circuit. In the voltage reference circuit 20 the specific resistance value is divided in half and the "mid-terminal" point between the two MOSFETs tapped for reasons which will be explained subsequently.

The sense amplifier 19 is the subject of copending U.S. Patent Application, Ser. No. 048,559 filed on June 14, 1979.

A MOSFET $Q_{23}$ of enhancement type is also provided connected between $V_{CC}$ and the selected bit line.

MOSFET $Q_{23}$ is what may be called a "level dependent pull-up" device.

Typically, the minimum voltage level of the bit lines is 0.6 to 1.0 volts lower than the voltage at the source of MOSFET $Q_{20}$. The reference voltage is about 0.3 to 0.5 volts lower than the voltage at the source of MOSFET $Q_{20}$. Bit line voltages lower than about one volt below the voltage at the source of MOSFET $Q_{20}$ are not desired and could be detrimental to the operating speed of the ROM. This is because a newly selected bit line has a voltage close to zero volts, and the bit line has to be charged rapidly to a level close to the reference voltage at node B. When the bit line is more than one enhancement threshold voltage (about one volt) down from the voltage at the source of MOSFET $Q_{24}$ in circuit 20, MOSFET $Q_{23}$ conducts and aids the pull-up of the bit line. MOSFET $Q_{23}$ has no conduction when the bit line voltage is one enhancement threshold voltage below the voltage at the source of $Q_{24}$. The series connected MOSFETs $Q_{20}$, $Q_{21}$, and $Q_{22}$ will charge the bit line to a higher voltage if the selected memory cell MOSFET is an enhancement MOSFET.

The voltage reference circuit 20 comprises MOSFET $Q_{24}$, which is the same size as MOSFET $Q_{20}$ and MOSFETs $Q_{25}$ and $Q_{26}$ which are the same size as depletion type MOSFETs $Q_{21}$ and $Q_{22}$ respectively. The MOSFETs $Q_{24}$, $Q_{25}$, and $Q_{26}$ have their conduction paths connected in series.

The MOSFET $Q_{24}$ has one conduction path electrode connected to $V_{CC}$, and its other conduction path electrode connected to a condition path electrode of MOSFET $Q_{25}$. The gate electrode of $Q_{24}$ is also connected to $V_{CC}$. The gate electrode of $Q_{25}$ is connected to the node between the conduction path electrodes of $Q_{25}$ and $Q_{26}$. The circuit 20 further consists of a series-connected in sequence of MOSFETs $Q_{27}$, $Q_{28}$, $Q_{29}$, $Q_{30}$, $Q_{31}$, $Q_{32}$, $Q_{33}$, $Q_{34}$, $Q_{35}$, $Q_{36}$, $Q_{37}$, $Q_{38}$, $Q_{39}$, $Q_{40}$, $Q_{41}$, $Q_{42}$, $Q_{43}$, $Q_{44}$, and $Q_{45}$, i.e. nineteen MOSFETs in total. Such a sequence of MOSFETs is to provide a voltage reference input to the sense amplifier 19 which provides process and parameter tracking for the "worst case" for a typical output column, such as 18A. There are a total of nineteen MOSFETs in the circuit 20 to correspond to the sixteen memory cell transistors (e.g. $Q_2$–$Q_{17}$), the one Y-select transistor (e.g. $Q_1$), and two Z-select transistors (e.g., $Q_{18}$ and $Q_{19}$). All MOSFETs except one in the circuit 20 are enhancement type MOSFETs, and one MOSFET is a depletion type MOSFET. The gates of all the enhancement type MOSFETs are connected to $V_{CC}$, so therefore all the enhancement MOSFETs in 20 are on, while the gate of single depletion type MOSFET in 20 is connected to ground. This achieves the effect that the reference exactly models a selected memory cell column (output column) (18a, etc.) with one depletion MOSFET cell and fifteen enhancement MOSFET cells, the depletion MOSFET cell being selected.

The depletion MOSFET is chosen as the fourth MOSFET in the series, that is MOSFET $Q_{30}$, for the reason that the depletion MOSFET in this position has the highest source voltage and thus the smallest gate-to-source voltage which results in the largest on resistance possible.

The specific configuration described above is a "worst case" in that the memory cell column has the largest resistance conduction path possible. Thus the voltage of the bit line is to be detected as a low due to the presence of a conductor path. Since the column has the largest possible resistance, this low voltage will have its maximum value so that it is the most difficult to detect, i.e. "worst case".

A MOSFET $Q_{46}$ is provided which has its gate connected between the conducting path electrodes of MOSFET $Q_{36}$ and $Q_{37}$ in the voltage reference circuit 20.

MOSFET $Q_{46}$ limits the value of the reference voltage at high supply voltages ($V_{CC} > 6$ volts). Its gate position in the series MOSFETs (which act inherently as a voltage divider) is chosen so that its gate voltage is about 0.9 volts (one enhancement threshold voltage) when $V_{CC} = 6$ volts. Thus MOSFET $Q_{46}$ is not turned on and has no effect when $V_{CC} < 6$ volts. The reference is limited to keep it within the operating voltage range of the differential amplifier (sense amp), circuit 19.

One of the conduction path electrodes of this MOSFET $Q_{46}$ is connected to the node B between MOSFET $Q_{25}$ and $Q_{26}$.

A depletion type MOSFET $Q_{47}$ is also provided having its gate electrode connected to the same node B and having its source and drain electrodes connected together and to ground. Such a depletion type MOSFET therefore forms a capacitor which is sized in a predetermined manner to match the capacitance of the bit lines. This capacitance matching provides immunity from noise on the $V_{CC}$ voltage supply. The magnitude of the injected noise on nodes A and B is equal and therefore is rejected by the differential amplifier, circuit 19. There are other means of providing such a capacitance matching, such as to use a single diffusion, but it is felt that such a depletion type MOSFET $Q_{47}$ achieves the same result using less area on the semiconductor chip. The node B is connected to the "input B" of the sense amplifier 19 and serves as the voltage reference input.

It is important to note that the bit line is selected so that it is about one enhancement threshold voltage down from the $V_{CC}$ voltage so that input A is in a desirable operating range for sense amplifier 19. The operating voltage range of input A is determined by $Q_{20}$, $Q_{21}$, $Q_{22}$ and the selected memory cell column (18a, etc.). If the selected memory cell column has no conduction path due to selection of a memory cell which is an enhancement MOSFET, then MOSFET $Q_{20}$ will charge input A to a logic one voltage level which is one enhancement MOSFET threshold voltage below $V_{CC}$. If the selected memory cell column has a conduction path due to the selection of a cell which is a depletion MOSFET, then input A will assume a logic zero voltage level that is determined by the threshold voltage of MOSFET $Q_{20}$, the series resistance of MOSFETs $Q_{21}$ and $Q_{22}$, and the current flow through the selected memory cell column.

Because the capacitance of the bit lines is relatively large, it is important (for speed) to have as small a voltage swing on the bit line and at node A as possible. This is achieved in design by having the series resistance of MOSFETs $Q_{20}$, $Q_{21}$, and $Q_{22}$ relatively small as compared to the series resistance of the selected memory cell column. How small the voltage swing may be is limited by the sensitivity of the sense amplifier, 19.

MOSFETs $Q_{21}$ and $Q_{22}$ are connected in series to form an impedance of a predetermined amount. The same predetermined impedance is reflected in the voltage reference circuits as $Q_{25}$ and $Q_{26}$, but in the voltage reference circuit there is a tap near the center of the impedance between the conduction path electrodes $Q_{25}$ and $Q_{26}$ so as to provide the proper reference voltage level for the sense amplifier 19. Such a center tap is believed to be a significant feature of the present invention since it enables the reference voltage, input B of the sense amplifier 19 to be accurately centered between the logic one voltage level and the logic zero voltage level on input A of the sense amplifier 19.

Because the reference circuit 20 is constructed identically to the memory cell column-selection circuit-pull-up circuits, the reference is centered automatically and without regard to process parameters or the magnitufe of $V_{CC}$.

Finally the output of the sense amplifier 19 is connected to a buffer circuit 21 which provides an indication of whether a logic one or a logic zero has been detected by the sense amplifier. In a preferred embodiment according to the present invention, the typical reference voltage provided on node B is 3.1 volts. The typical reference voltage provided as the input A to the sense amplifier is 3.5 volts to represent a 0-bit and 2.8 volts to represent a 1-bit. 2.8 volts for a 1-bit is the worst case level, the "highest low" of the bit line. With a memory cell column (18a, etc.) composed entirely of depletion MOSFET cells, this value would be as low as 2.0 volts. Therefore the "typical" 1-bit level varies according to the ROM code and will be between 2.0 and 2.8 volts. When a 0-bit is detected on the input A, a voltage of 5.0 (or $V_{CC}$) volts appears on the output of the sense amplifier. When a 1-bit is detected on the input A, a voltage of 1.7 volts appears on the output of the sense amplifier. The inverter stage whose input is the output of the sense amplifier is sized (ratioed) to achieve a good logic one level despite this poor logic zero level of 1.7 volts. Typically, logic zero levels are less than 0.5 volts which is less than one enhancement threshold voltage.

The buffer circuit 21 is connected with one of the eight output lines of the memory circuit to indicate to the external circuitry whether a "1" or a "0" -bit is stored in the addressed memory location.

While the invention has been illustrated and described as embodied in a static read-only memory, it is not intended to be limited to the details shown, since various modifications and structural changes may be made without departing in any way from the spirit of the present invention.

It will be obvious to those skilled in the art that the semiconductor device according to the present invention can be manufactured with various semiconductor technologies and different combinations of known process steps, and that the preferred embodiments illustrated here are merely exemplary. The depth of penetration of the various zones and regions and in particular the configuration and distance between the active zones of the transistor devices, as well as the concentrations of dopant species, and/or their concentration profiles, can be chosen depending upon the desired properties. These and other variations can be further elaborated by those skilled in the art without departing from the scope of the present invention.

The present invention is also not restricted to the specific semiconductor materials and circuits described. For example, it may be pointed out that semiconductor materials other than silicon, for example $A_{III}$-$B_V$ compounds, may be used. Furthermore, the conductivity types in the embodiment may be interchanged and corresponding to such change, the polarity of the respective operating voltages adapted. Moreover, the voltage level and the static or dynamic nature of the signals applied to the various terminals and gates of the device, as well as the voltage sources, may be suitably selected as desired for a particular application.

Without further analysis, the foregoing will so fully reveal the gist of the present invention that others can, by applying current knowledge, readily adapt it for various applications without omitting features that, from the standpoint of prior art, fairly constitutes essential characteristics of the generic or specifc aspects of this invention, and, therefore, such adaptations should and are intended to be comprehended within the meaning and range of equivalence of the following claims.

What is claimed is:

1. In combination with an electronic memory of the type having a plurality of substantially identical memory cells each composed of one transistor device, each transistor device including a control electrode and first and second conduction path electrodes, wherein a plurality of such memory cells are arranged in sets, each set including a plurality of input rows and a plurality of output columns, the control electrode of the transistor devices in each input row being formed in common, and the first conduction path electrodes of the transistor devices within each output column being connected in electrical series to the second conduction path electrode of adjacent transistor devices in each output column, so that a control electrode-controlled series conduction path is established through each output column of transistor devices in each set:

means connecting each corresponding input row in a group of said sets of memory cells to form common input lines;

means connecting each of said output columns in a group to form a single common bit line, each of said bit lines in a group being connected to a single common group output line;

a source of relatively positive and a source of relatively negative potential, said source of relatively positive potential being selectively connectable with said single common group output line so as to be connectable with one end of said series conduction path through each output column of transistors, the other end of said series conduction path being connected to said source of relatively negative potential;

a sense amplifier having a first input selectively connectable with said single common group output line by first and second series connected MOS field effect transistors, and a second input; and a tracking reference voltage circuit connected to one of said inputs of said sense amplifier, said voltage reference comprising a series circuit of field effect transistors having a first end terminal, an intermediate terminal, and a second end terminal connected to ground.

2. A combination as defined in claim 1, wherein said tracking voltage reference circuit comprises:

a relatively positive voltage input terminal;

a first enhancement mode field effect transistor having a first conduction path electrode connected to said voltage input terminal, a second conduction path electrode forming a first output and a control electrode connected to said voltage input terminal;

a depletion type second field effect transistor having a first conduction path electrode connected to said first output, a second conduction path electrode forming a second output, and a control electrode connected to said second output;

a depletion type third field effect transistor having a first conduction path electrode connected to said second output, a second conduction path electrode forming a third output, and a control electrode connected to said third output, said third output being connected to said first end terminal of said series circuit of field effect transistors.

3. A combination as defined in claim 2, wherein said series connection of field effect transistors comprises a series of eighteen field effect transistors having their conduction paths connected in series and their control electrodes connected to a relatively positive voltage input.

4. A combination as defined in claim 3, wherein said series connection of field effect transistors comprises seventeen enhancement type field effect transistors and one depletion type field effect transistor, the depletion type field effect transistor being the fourth field effect transistor in the sequence from said third output to ground.

5. A combination as defined in claim 2, wherein said second output is connected to said second input of said sense amplifier.

6. A combination as defined in claim 2, further comprising a field effect transistor having a first conduction path electrode connected to said relatively positive voltage input terminal, a second path conduction path electrode connected to the output of said source of relative positive potential, and a control electrode connected to said first output of said tracking reference voltage circuit.

7. A combination as defined in claim 2, further comprising a depletion type field effect transistor having its first and second conduction path electrodes connected to ground and its control electrode connected to said second output of said tracking reference voltage circuit.

8. A combination as defined in claim 2, further comprising an enhancement type field effect transistor having a first conduction path electrode connected to said second output of said tracking reference voltage circuit, a second conduction path electrode connected to ground, and a control electrode connected to said intermediate terminal of said tracking reference voltage circuit.

9. In combination with an electronic memory of the type having a plurality of substantially identical memory cells each composed of one transistor device, each transistor device including a control electrode and first and second conduction path electrodes, wherein a plurality of such memory cells are arranged in sets, each set including a plurality of input rows and a plurality of output columns, the control electrode of the transistor devices in each input row being formed in common, and the first conduction path electrodes of the transistor devices within each output column being connected in electrical series to the second conduction path electrode of adjacent transistor devices in each output column, so that a control electrode-controlled series conduction path is established through each output column of transistor devices in each set:

means connecting each corresponding input row in a group of said sets of memory cells to form common input lines;

means connecting each of said output columns in a group to form a single common bit line, each of said bit lines in a group being connected to a single common group output line; and a source of relatively positive and a source of relatively negative potential, said source of relatively positive potential including:

a relatively positive voltage input terminal;

an enhancement type first field effect transistor having a first conduction path electrode connected to said relatively positive voltage input terminal, a control electrode connected to said relatively positive voltage input terminal, and a second conduction path electrode;

a depletion type second field effect transistor having a first conduction path electrode connected to said second conduction path electrode, a second conduction path electrode, and a control electrode connected to said second conduction path electrode; and a depletion type third field effect transistor having a first conduction path electrode connected to said second conduction path electrode of said second field effect transistor, a second conduction path electrode forming the output of said source of relatively positive potential, and a control electrode also connected to the output of said source of relatively positive potential;

said source of relatively positive potential being selectively connectable with said single common group output line so as to be connectable with one end of said series conduction path through each output column of transistors, the other end of said series conduction path being connected to said source of relatively negative potential.

10. In combination with an electronic memory of the type having a plurality of substantially identical memory cells each composed of one transistor device, each transistor device including a control electrode and first and second conduction path electrodes, wherein a plurality of such memory cells are arranged in sets, each set including a plurality of input rows and a plurality of output columns, the control electrode of the transistor devices in each input row being formed in common, and the first conduction path electrodes of the transistor devices within each output column being connected in electrical series to the second conduction path electrode of adjacent transistor devices in each output column, so that a control electrode-controlled series conduction path is established through each output column of transistor devices in each set:

means connecting each corresponding input row in a group of said sets of memory cells to form common input lines;

means connecting each of said output columns in a group to form a single common bit line, each of said bit lines in a group being connected to a single common group output line;

a source of relatively positive and a source of relatively negative potential, said source of relatively positive potential being selectively connectable with said single common group output line so as to be connectable with one end of said series conduction path through each output column of transistors, the other end of said series conduction path being connected to said source of relatively negative potential;

a sense amplifier having a first input selectively connectable with said single common group output line by first and second series connected MOS field effect transistors, and a second input;

said sense amplifier comprising in combination:

first, second, third, fourth, fifth and sixth multiterminal semiconductor devices having respective conduction path terminals and a control terminal;

the conduction paths of the first and second of said multiterminal devices connected in a first series circuit;

the conduction paths of the first and the fifth of said multiterminal devices connected in a second series circuit;

the conduction paths of the third and fourth of said multiterminal devices connected in a third series circuit;

the conduction paths of the third and the sixth of said multiterminal devices connected in a fourth series circuit, said first and third series circuits connected together to form a first electrical junction with a source of relatively positive reference potential;

the first output terminal connected to both the control terminal of said first device, to the first series circuit formed by the conduction paths of said first and second devices, and to the control terminal of said sixth device;

a second output terminal connected to both the control terminal of said third device, the third series circuit formed by the conduction paths of said third and said fourth and sixth devices, and to the control terminal of said fifth devices;

first and second input terminals respectively connected to the control terminals of said second and said fourth devices;

said fifth multiterminal semiconductor device having a conduction path in parallel with said second semiconductor device;

said sixth multiterminal semiconductor device having a conductor path in parallel with said fourth semiconductor device;

a seventh multiterminal semiconductor device having conduction path terminals and a control terminal;

said seventh multiterminal semiconductor device connected between a source of relatively negative reference potential and a second electrical junction formed by the connection together of said first, second, third, and fourth series circuits; and positive feedback means connected between said first output terminal and the control terminal of said seventh multiterminal device to control the conductivity of said seventh device.

* * * * *

UNITED STATES PATENT AND TRADEMARK OFFICE
CERTIFICATE OF CORRECTION

PATENT NO. : 4,274,147
DATED : June 16, 1981
INVENTOR(S) : Clarence W. Padgett et al It is certified that error appears in the above-identified patent and that said Letters Patent are hereby corrected as shown below:

In column 2, line 1, please delete [are] and insert --art--.

In column 2, line 17, please delete [condition] and insert --conduction--.

In column 3, line 14, please delete [rt] and insert --art--.

In column 4, line 1, please delete [differentation] and insert --differentiation--.

In column 5, line 11, please delete [,].

In column 4, line 67, please delete [an] and insert --and--.

In column 6, line 36, please delete [in].

In column 6, line 68, please delete [conductor] and insert --conduction--.

UNITED STATES PATENT AND TRADEMARK OFFICE
CERTIFICATE OF CORRECTION

PATENT NO. : 4,274,147

DATED : June 16, 1981

INVENTOR(S) : Clarence W. Padgett et al

It is certified that error appears in the above-identified patent and that said Letters Patent are hereby corrected as shown below:

In column 7, line 5, please delete [conducting] and insert --conduction--.

In column 7, line 61, please delete [,].

Column 8, line 10, delete [magnitufe] and insert --magnitude--.

Signed and Sealed this

Twenty-sixth Day of January 1982

[SEAL]

Attest:

Attesting Officer

GERALD J. MOSSINGHOFF

Commissioner of Patents and Trademarks